US010415781B2

(12) United States Patent
Pellarin et al.

(10) Patent No.: US 10,415,781 B2
(45) Date of Patent: Sep. 17, 2019

(54) MONOLITHIC LIGHT SOURCE FOR A MOTOR-VEHICLE LIGHTING MODULE

(71) Applicant: VALEO VISION, Bobigny (FR)

(72) Inventors: Marie Pellarin, Bobigny (FR); Vanesa Sanchez, Bobigny (FR); Benoit Delande, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/923,508

(22) Filed: Mar. 16, 2018

(65) Prior Publication Data

US 2018/0274743 A1  Sep. 27, 2018

(30) Foreign Application Priority Data

Mar. 24, 2017  (FR) .................................... 17 52499

(51) Int. Cl.
| | |
|---|---|
| *F21S 41/143* | (2018.01) |
| *F21S 41/155* | (2018.01) |
| *F21S 41/663* | (2018.01) |
| *B60Q 1/14* | (2006.01) |
| *H01L 33/06* | (2010.01) |
| *H01L 33/08* | (2010.01) |

(Continued)

(52) U.S. Cl.
CPC .............. *F21S 41/143* (2018.01); *B60Q 1/14* (2013.01); *F21S 41/155* (2018.01); *F21S 41/25* (2018.01); *F21S 41/62* (2018.01); *F21S 41/663* (2018.01); *H01L 33/06* (2013.01); *H01L 33/08* (2013.01); *H01L 33/24* (2013.01); *H01L 33/32* (2013.01); *H01L 33/387* (2013.01); *B60Q 2400/20* (2013.01); *F21W 2102/10* (2018.01); *F21W 2102/135* (2018.01); *F21Y 2115/10* (2016.08)

(58) Field of Classification Search
CPC .. B60Q 1/14; B60Q 1/28; F21S 41/143; F21S 41/147; F21S 41/155; F21S 41/663
USPC ........................................................... 315/77
See application file for complete search history.

(56) References Cited

U.S. PATENT DOCUMENTS

| | | | | |
|---|---|---|---|---|
| 9,711,700 B2 * | 7/2017 | Miyamoto | .............. | H01L 33/62 |
| 2005/0116179 A1 * | 6/2005 | Aguirre | ................ | A61C 19/004 |
| | | | | 250/492.1 |

(Continued)

FOREIGN PATENT DOCUMENTS

| | | |
|---|---|---|
| FR | 3 030 995 A1 | 6/2016 |
| WO | WO 2008/109296 A1 | 9/2008 |

OTHER PUBLICATIONS

French Preliminary Search Report dated Nov. 16, 2017 in French Application 17 52499 filed on Mar. 24, 2017 (with Translation of Categories Cited Documents).

*Primary Examiner* — Tung X Le (74) *Attorney, Agent, or Firm* — Oblon, McClelland, Maier & Neustadt, L.L.P.

(57) ABSTRACT

This monolithic light source for a motor-vehicle lighting module includes an emission area formed by a plurality of emitting elements and configured so that the emitting elements are arranged in at least three selectively activatable segments, these at least three selectively activatable segments including a first segment and a second segment, which are symmetric to each other with respect to a plane of symmetry and which have a contact zone that extends along this plane of symmetry, and a third section, which extends from one end of this contact zone and which extends symmetrically on either side of the plane of symmetry.

20 Claims, 3 Drawing Sheets

(51) Int. Cl.
*H01L 33/24* (2010.01)
*H01L 33/32* (2010.01)
*H01L 33/38* (2010.01)
*F21S 41/62* (2018.01)
*F21S 41/25* (2018.01)
*F21W 102/135* (2018.01)
*F21Y 115/10* (2016.01)
*F21W 102/10* (2018.01)

(56) References Cited

U.S. PATENT DOCUMENTS

| | | | |
|---|---|---|---|
| 2005/0265024 A1* | 12/2005 | Luk | F21S 10/02 |
| | | | 362/231 |
| 2007/0230204 A1* | 10/2007 | Tatsukawa | F21S 41/143 |
| | | | 362/539 |
| 2010/0117997 A1 | 5/2010 | Haase | |
| 2011/0194302 A1* | 8/2011 | Kishimoto | G02B 6/0008 |
| | | | 362/511 |
| 2015/0069433 A1 | 3/2015 | Haase | |
| 2016/0087150 A1 | 3/2016 | Ristic et al. | |
| 2017/0276308 A1* | 9/2017 | Nakazawa | B60Q 1/1423 |
| 2019/0113197 A1* | 4/2019 | Kamiya | F21S 41/00 |

\* cited by examiner

MONOLITHIC LIGHT SOURCE FOR A MOTOR-VEHICLE LIGHTING MODULE

The invention relates to the field or of lighting and/or signalling, in particular for motor vehicles.

Motor vehicles are equipped with headlamps, or headlights, intended to illuminate the road in front of the vehicle, at night or in case of low light levels. These headlamps may generally be used in two lighting modes: a first "high beam" mode and a second "low beam" mode. The "high beam" mode allows the road to be brightly lit far in front of the vehicle. The "low beam" mode provides more limited illumination of the road, but nevertheless ensures good visibility while preventing other road users from becoming dazzled. These two lighting modes are used alternately depending on the traffic conditions encountered by the vehicle, and they are successively implemented via a manual switch of the vehicle or indeed automatically via a suitable control device.

Moreover, the modules present in headlamps are arranged so that the beams associated with the "low beam" mode have, in the upper portion thereof, a cutoff forming a step, in order to prevent drivers of oncoming vehicles from being overly discomforted. It will be understood that the beam to be obtained when the right-hand side of the road is driven will have a cutoff on the left-hand side, whereas, symmetrically, the beam to be obtained when the left-hand side of the road is driven on will have a cutoff on the right-hand side.

It is sought to obtain lighting modules capable of generating, via suitable control of a specific light source, and in particular formation of a step-shaped cutoff such as was just mentioned, both a beam associated with the "high beam" mode and a beam associated with the "low beam" mode. Document US2009180294 discloses the use of such a light source, this light source having emission zones that are noteworthy in that their simultaneous or selective activation allows an emission area specific to a "high beam" or to a "low beam" to be created.

It will be understood that all of the emission areas are activated to generate a "high beam" and that only some of the emission areas are activated to generate a "low beam".

As a result, there is no need, in the lighting module, between, on the one hand, a light source and a collector toward which the light source is able to emit light rays and which is configured to deviate these rays, and, on the other hand, an optic for forming the deviated rays in order to generate a directed beam that is output from the module, for a shield to be present on the path of the rays in order to cut off a portion of the rays and to give a suitable shape to the beam.

Although such a configuration is advantageous in that it implies one part less in the module, it requires provision to be made for different modules, with, in particular, a first or second type of light source, for vehicles intended to be driven on the right- or left-hand side of the road. It will be understood that design and manufacturing costs are impacted by the need to take this alternative into account.

The present invention aims to provide a light source and an associated lighting module that provide a solution allowing components to be standardized irrespectively of whether it is desired to install them in a vehicle intended to be driven on the left or a vehicle intended to be driven on the right. Below, the expressions "vehicle to be driven on the left" and "vehicle to be driven on the right" will be understood to mean a vehicle required to be driven on left-side lanes of the road and a vehicle required to be driven on right-side lanes of the road, respectively.

To this end, the invention aims to provide a monolithic light source for a motor-vehicle lighting module, comprising an emission area formed by a plurality of selectively activatable emitting elements and configured so that the emitting elements are arranged in at least three selectively activatable segments, these at least three selectively activatable segments including a first segment and a second segment, which are symmetric to each other with respect to a plane of symmetry and which have a contact zone that extends along this plane of symmetry, and a third section, which extends from one end of this contact zone and which extends symmetrically on either side of the plane of symmetry.

The expression "monolithic light source" is understood to mean a light source in which the emitting elements are light-emitting elements that are grown from a common substrate and that are electrically connected so as to be activatable selectively, individually or in subsets of emitting elements, the configuration of such a monolithic source allowing selectively activatable pixels to be arranged very close to one another with respect to conventional light-emitting diodes, which are intended to be soldered to printed circuit boards. The monolithic source, in the context of the invention, includes light-emitting elements a principal dimension of elongation of which, i.e. the height of which, is substantially perpendicular to a common substrate, this height being at least equal to one micron.

According to various features of the present invention, which may be applied alone or in combination:
the third segment has a strip shape the thickness of which at one end gradually decreases in order to form a tip the apex of which is coincident with the point of intersection of the first, second and third selectively activatable segments;
the tip participating in delineating the third segment makes, in the emission area, an angle with the plane of symmetry that is comprised between 15° and 90°, in particular comprised between 15° and 45°, and in particular equal to 35°+/−5°;
the emission area is rectangular;
the emission area is square, and it has a side length comprised between 2 and 4 mm, and in particular equal to 2.62 mm;
each of the emission segments extends as far as to one edge of the rectangular emission area;
each of the first and second segments includes a subset arranged along the third segment and at least partially along the contact zone between these two segments, from the point of intersection;
each subset extends along the entire length of the contact zone between the first segment and the second segment;
the width of each subset is constant from one edge to the other of the emission area of the source; by width, what is meant is the dimension of the strip perpendicular to the contact zone and/or perpendicular to the junction between the third segment and the first segment;
the emitting elements contained in a subset are configured to emit rays of light intensity higher than that of the rays emitted by the emitting elements contained in the rest of the first section or second section that includes said subset;
the density and/or height of the emitting elements in the subset is different from the density and/or height of the emitting elements in the rest of the corresponding segment, or indeed the emitting elements arranged in the subset are supplied with more power than the rest of the emitting elements of the corresponding segment;

the monolithic light source includes two additional segments that are placed symmetrically with respect to the plane of symmetry, in such a way as to encircle the first, second and third segments;

the monolithic light source includes means for poka-yoking its installation in the lighting module; these poka-yoking means may consist of a marker of specific colour or shape placed on the perimeter of the emission area, this marker being identifiable by an inspecting device during the installation of the monolithic light source in the lighting module.

The invention also relates to a lighting module including a monolithic light source such as just described and a forming optic. The monolithic light source and the forming optic may be configured so that the rays emitted by the monolithic light source strike the forming optic directly, without intermediate deviation. Furthermore, the forming optic may be configured to deform the image along at least one axis, and in particular along an axis contained in the emission area and perpendicular to the plane of symmetry, in order to modify the slope defined by the tip of the third segment.

In the lighting module according to the invention, the emission area of the monolithic light source may be square, with a side length substantially equal to 2.62 mm, and the monolithic light source may be placed at the focal point of the forming optic, at 30 mm therefrom.

The invention also relates to a motor-vehicle headlamp including a lighting module such as described above. This headlamp may include a complementary module configured to form a beam complementary to the beam output from the light module.

The invention furthermore relates to a lighting method for a motor vehicle, implementing control of a monolithic light source such as described above to produce a non-dazzling first lighting function by projection of a cutoff-comprising beam, or a long-range second lighting function by projection of a second cutoff-free beam. In this method, the orientation of the monolithic light source may be detected, via a direct measurement or indeed via collection of information relating to this orientation, and each of the three segments of the monolithic light source may be activated to produce the long-range second lighting function, and only one among the first and second segments may be activated to produce the non-dazzling first lighting function, the choice as to whether it is the first or second segment that is activated being dependent on the detected orientation of the monolithic light source.

According to one feature, the three segments may be activated to produce the second lighting function so as to produce the maximum light intensity permitted by the dimensions and structure thereof.

According to another feature, either the first or second segment may be activated to produce the first lighting function so as to produce a light intensity comprised between 30 and 50% of the maximum light intensity permitted by the dimensions and structure thereof.

Moreover, the subset of either the first or second segment may be activated to produce the first lighting function so as to produce a light intensity substantially equal to 50% of the maximum light intensity permitted by the dimensions and structure of the emitting elements composing said subset, whereas the rest of the corresponding first or second segment is activated to produce the first lighting function so as to produce a light intensity substantially equal to 30% of the maximum light intensity permitted by the dimensions and structure of the emitting elements composing it, the emitting elements of the subset and of the rest of the first or second segment being identical.

The aforementioned and other features of the invention will become more clearly apparent on reading the following detailed description of nonlimiting examples with reference to the appended drawings, in which.

Figure 1:
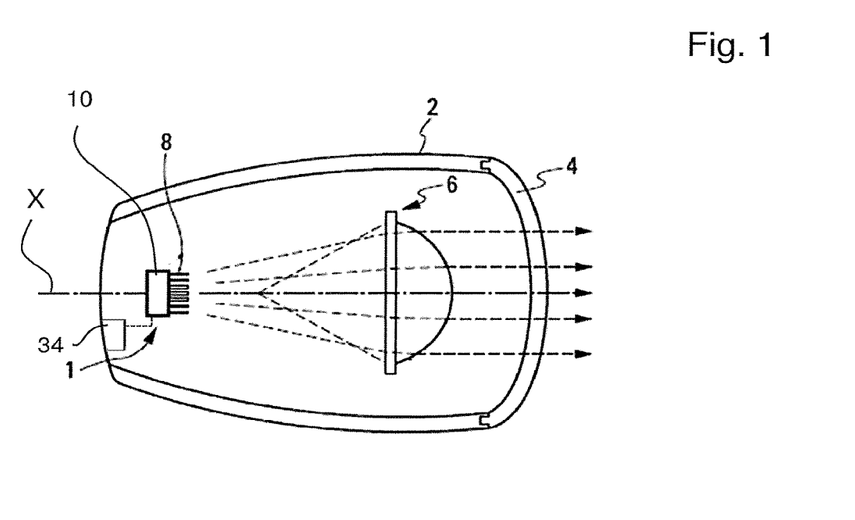
FIG. 1 is a schematic representation of a casing of an adaptive lighting device, in which are housed a monolithic light source and an optic for forming emitted rays, in which figure light rays emitted by the monolithic light source and deviated by the forming optic have been illustrated.

A lighting module configured to be integrated into a headlamp of a motor vehicle, such as is the subject matter of one aspect of the invention, includes a monolithic light source 1, in particular housed in a casing 2 that is closed by an outer lens 4 and that defines an internal volume for receiving this lighting module. The monolithic light source is associated with an optic 6 for forming at least some of the light rays emitted by the light source, the forming optic also being housed in the casing and including at least one lens, a convergent lens for example. The forming optic changes the direction of at least some of the light rays emitted by the source in order to allow an adaptive light beam to be emitted from the module and substantially parallel to an optical axis X of the module, which is illustrated in FIG. 1. The forming optic is thus configured to deform the image along at least one axis.

The lighting module here operates in a direct imaging mode, with the monolithic light source and forming optic configured so that the rays emitted by the light source strike the forming optic directly, without intermediate deviation.

The monolithic light source 1 has a light-emitting area 30 defined by a plurality of emitting elements 8 distributed so as to form three segments that are addressable, and more particularly activatable, selectively via a control module associated with the light source—the module may generate a "high beam" or a "low beam" by selectively turning on the emitting elements of one segment rather than those of another segment. How this control is achieved will be described below.

The configuration of the monolithic light source, namely in particular the arrangement of the emitting elements 8 into selectively activatable segments, is dependent on the type of "low beam" that is desired, and in particular on the slope and height of the step forming the cutoff of the beam.

According to the invention, the light source is monolithic in that a plurality of emitting elements 8 protrude from a common substrate from which they were respectively grown. Various arrangements of emitting elements may meet this definition of a monolithic source, provided that one of the main dimensions of elongation of the emitting elements is substantially perpendicular to a common substrate and that the distance separating the pixels, formed by groups of one or more emitting elements, is small in comparison to the distances separating known arrangements of flat square chips soldered to a printed circuit board.

In particular, the monolithic light source according to one aspect of the invention may include, such as will be described in greater detail below, a plurality of light-emitting elements, which are separate from the one another, and which are grown from the substrate individually, these elements being electrically connected in such a way as to be selectively activatable—where appropriate, in subsets, within which the rods may be activated simultaneously.

As a variant, the light source may include emitting elements formed by layers of light-emitting elements that are superposed on a single substrate and that are cut to form a plurality of pixels that are all located on the same substrate. The result of such a process is a plurality of emitting blocks that are all located on the same substrate and that are all electrically connected in order to be activatable selectively from one another.

It will be understood that, with each of these ways of producing a monolithic source according to the invention, it is thus possible, either via the electrical connection of the emitting elements, which are separate from one another, or indeed via suitable choice of the pattern of cuts used to form the emitting blocks, to produce, in the light-emitting area, arrangements of selectively activatable segments that are particular either in terms of their shapes or in terms of their dimensions.

Figure 2:
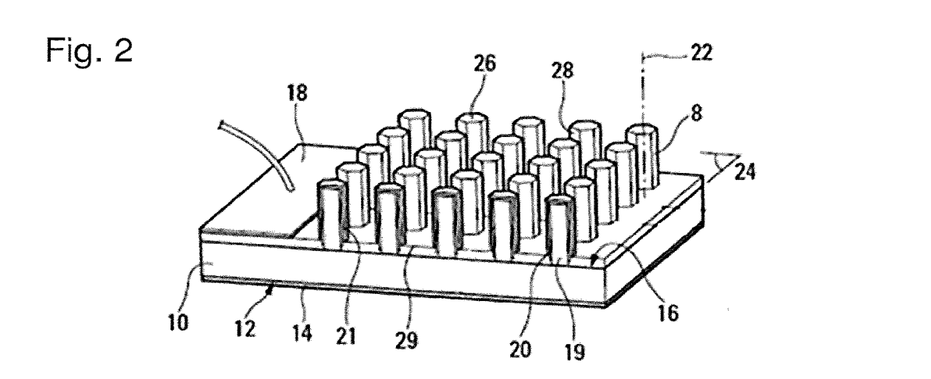
FIG. 2 is a schematic perspective representation of the monolithic light source of FIG. 1, in which figure a row of light-emitting rods has been shown in cross section.

Such as illustrated in FIG. 2, the light source 1 thus comprises a plurality of light-emitting elements 8, of submillimetre dimensions, that are arranged protruding from a substrate 10 so as here to form rods of hexagonal cross section. The light-emitting rods 8 lie parallel to the optical axis X of the lighting module when the light source 1 and the forming optic 6 are in position in the casing 2.

These light-emitting rods 8 are grouped, in particular via electrical connections that are specific to each set, into a plurality of selectively activatable segments. The specific design of the arrangement of these segments, which arrangement will be described below, is chosen in order to make it possible to achieve passage from a "high beam" to a "low beam" and vice versa simply, both in a left-hand drive vehicle and in a right-hand drive vehicle.

Growth of the light-emitting rods 8 is initiated on a first face of a substrate 10. Each light-emitting rod, here formed from gallium nitride (GaN), protrudes perpendicularly, or substantially perpendicularly, from the substrate, which is here made of silicon, other materials such as silicon carbide being usable without departing from the scope of the invention. By way of example, the light-emitting rods could be made from an alloy of aluminium nitride and gallium nitride (AlGaN), or from an alloy of aluminium, indium and gallium phosphides (AlInGaP).

The substrate 10 has a lower face 12, to which is added a first electrode 14, and an upper face 16, from which the light-emitting rods 8 protrude, this face playing the role of the first face of the substrate, which face was mentioned above, and to which a second electrode 18 is added. Various layers of materials are superposed on the upper face 16, in particular after growth of the light-emitting rods from the substrate, this growth here using a bottom-up approach. These various layers include at least one layer of electrically conductive material, in order to allow electrical power to be supplied to the rods. This layer is etched so as to connect such or such a rod to such or such other rods. These light-emitting rods can then be turned on simultaneously by a control module (not shown here). Provision will then possibly be made for at least two light-emitting rods or at least two groups of light-emitting rods to be arranged so as to be able to be turned on separately, by way of a system for controlling their turn-on.

The light-emitting rods extend from the substrate and, such as may be seen in FIG. 2, they each include a core 19 made of gallium nitride, around which are placed quantum wells 20 formed by a radial superposition of layers of different materials, here gallium nitride and indium-gallium nitride, and a shell 21 surrounding the quantum wells, which is also made of gallium nitride.

Each light-emitting rod extends along an axis of elongation 22 defining its height, the base of each rod being located in the plane 24 of the upper face 16 of the substrate 10.

The light-emitting rods 8 of a given light source advantageously have the same shape. They are each bounded by a terminal face 26 and by a circumferential wall 28 that extends along the axis of elongation of the rod. When the light-emitting rods are doped and biased, the resulting light generated as output from the semiconductor source is emitted essentially from the circumferential wall 28, it being understood that light rays may also exit from the terminal face 26. As a result, each light-emitting rod acts as a single light-emitting diode and the luminance of the light source is improved, on the one hand by the density of the light-emitting rods 8, and on the other hand by the size of the illuminating area, which is defined by the circumferential wall and which therefore extends over the entire perimeter, and entire height, of the rod.

The circumferential wall 28 of a light-emitting rod 8, corresponding to the gallium-nitride shell, is covered with a transparent conductive oxide (TCO) layer 29 that forms the anode of each rod, this anode being complementary to the cathode formed by the substrate. This circumferential wall 28 extends along the axis of elongation 22 from the substrate 10 to the terminal face 26, the distance from the terminal face 26 to the upper face 16 of the substrate, on which growth of the light-emitting rods 8 is initiated, defining the height of each rod. By way of example, provision may be made for the height of a light-emitting rod 8 to be comprised between 1 and 10 microns, whereas provision will be made for the largest transverse dimension of the terminal face, perpendicularly to the axis of elongation 22 of the rod in question, to be smaller than 2 microns. Provision will also possibly be made for the area of a rod, in a cross-sectional plane perpendicular to this axis of elongation 22, to be comprised in a set range of values, and in particular between 1.96 and 4 square microns.

It will be understood that, during formation of the light-emitting rods 8, it may be chosen to make their heights differ from one zone of the light source to another, so as to increase the luminance of the corresponding zone if the average height of the constituent rods thereof is increased. Thus, a group of light-emitting rods may have a height, or heights, that are different from another group of light-emitting rods, these two groups being constituents of the same semiconductor light source, this source being based on light-emitting rods of submillimetre dimensions.

The shape of the light-emitting rods 8 and in particular the cross section of the rods and the shape of the terminal face 26 may also vary from one device to the next. The rods have a generally cylindrical shape, and they may in particular have a cross section of polygonal and more particularly hexagonal shape. It will be understood that it is important for the light be able to be emitted through the circumferential wall, irrespectively of whether the latter has a polygonal or circular shape.

Moreover, the terminal face 26 may be substantially planar and make a right angle to the circumferential wall, and hence lie substantially parallel to the upper face 16 of the substrate 10, or indeed it may be curved or have a tip at its centre, so as to manipulate the directions of emission of the light exiting from this terminal face.

In one variant (not shown) the semiconductor light source 1 may furthermore include a polymer layer in which the light-emitting rods are at least partially embedded. Thus, the entire extent of the substrate may be covered by the layer, or only a given group of light-emitting rods may be surrounded by the layer. The polymer, which may in particular be based on silicone, creates a protective layer that allows the light-emitting rods to be protected without however hindering transmission of the light rays. Furthermore, it is possible to integrate, into this polymer layer, wavelength-converting means, luminophores for example, that are able to absorb at least some of the rays emitted by one of the rods and to convert at least some of said absorbed excitation light into emission light having a wavelength different from that of the excitation light. The wavelength-converting means may be embedded into the bulk of the polymer, or indeed placed on the surface of the polymer layer.

The light source may furthermore include a coating of a light-reflecting material that is placed between the light-emitting rods 8 in order to deviate those rays that are initially oriented toward the substrate toward the terminal face 26 of the light-emitting rods 8. In other words, the upper face 16 of the substrate 10 may include a reflecting means that redirects those light rays that are initially oriented toward the upper face 16 toward the exit face of the light source. Rays that would otherwise be lost are thus collected. This coating is placed between the light-emitting rods 8, on the transparent conductive oxide layer 29.

The light-emitting rods 8 are arranged in a two-dimensional matrix array. This arrangement could be such that the rods are arranged staggered. Generally, the rods are placed at regular intervals on the substrate 10, and the distance separating two immediately adjacent light-emitting rods, in each of the dimensions of the matrix array, must be at least equal to 2 microns, in order for the light emitted by the circumferential wall 28 of each rod 8 to be able to exit from the matrix array of light-emitting rods. Moreover, provision may be made for these separating distances, measured between two axes of elongation 22 of adjacent rods, not to be larger than 100 microns.

The light-emitting rods 8 of submillimetre dimensions define, in a plane that is substantially parallel to the substrate 10, a given emission area 30. It will be understood that the shape of this emission area is defined depending on the number and arrangement of its constituent emitting elements. In the following, the emission area is defined to have a substantially rectangular shape, although it will be understood that it is possible for this area to have a different and indeed any shape without departing from the scope of the invention.

In particular, the emission area 30 may be square shaped, such as illustrated in the figures. By way of nonlimiting example, the emission area may have a side length equal to 2.66 mm.

The light source 1 is placed at the focal point F of the forming optic, so that the rays emitted by the light source exit from the headlamp substantially parallel to the optical axis X. By way of nonlimiting example, the light source will possibly be placed at 30 mm therefrom.

According to the invention, and whatever the shape of the emission area 30, the latter includes at least three selectively activatable segments, including a first segment 31, a second segment 32 and a third segment 33. These three segments are electrically connected to one another selectively in order to form distinct and advantageously complementary zones that may be turned on/off. A control module 34 (shown in FIG. 1) associated with the light source 1 is configured to activate at least one segment independently of the other segments, or indeed to activate all of the segments simultaneously.

As was described above, the light-emitting-rod-based semiconductor light source 1 that will be described below is employed in the context of the use of a lighting device moreover including a forming optic 6 able to image, at infinity, at least one portion of the light rays emitted by the various rods segments of the light source, with a view to generating at least two lighting and/or signalling functions, namely at least one "high beam" type function and one "low beam" type function.

A first embodiment of the light source 1 will now be described, in which the emitting elements 8 are arranged so that the emission area 30 includes three selectively activatable segments inside of which all the emitting element are alike.

Such as was stated above, such an embodiment may be implemented with any type of monolithic source, i.e. not only with light-emitting rods that protrude from one and the same substrate, i.e. rods such as described above, but also with emitting blocks obtained by cutting light-emitting layers that are superposed on one and the same substrate.

The first segment 31 and the second segment 32 are arranged symmetrically to each other with respect to a plane of symmetry P1, and the third segment 33 overlaps this plane of symmetry over only some of the length of the emission area along this plane of symmetry, while also extending either side of the plane of symmetry. The first and second segments have a common edge, which defines a zone 35 of contact between these segments. The contact zone 35 is coincident with the straight line formed at the junction of the plane of symmetry P1 and of the plane in which the emission surface is inscribed. The third section 33 has an internal end 331 that is arranged inside the light source and an external end 332 that opens onto an edge of the light source. The third segment takes the form of a strip, the internal end 331 of which extends to a tip that is centred on the plane of symmetry, and that makes, in the emission area, an angle α (shown in FIGS. 4 to 7) to the plane of symmetry that is equal to 35°, it being understood that variations, for example of about 5°, are envisageable. Provision could be made, as a variant, for the tip to have a different shape: for example, the tip could have an inclination comprised between 15 and 90° and advantageously between 15 and 45°. It will be understood that the variation in the slope makes it possible to generate, in the projected beam of the "low beam" type, a more or less abrupt step for the cutoff of the beam.

As a result of this arrangement the apex of the tip formed at the internal end 331 of the third segment 33 is coincident with the point of intersection 36 of the first, second and third selectively activatable segments 31, 32 and 33.

The first segment 31 has one internal edge that is common, in succession, with the two other segments, and three external edges that delineate the peripheral outline of the emission area. Symmetrically, the second segment participates in delineating the emission area. Furthermore, such as was stated above, the third segment has an external end 332 that opens onto one edge of the light source. As a result thereof, each of the sides of the light source is formed by an edge of at least one of the selectively activatable segments and each of the selectively activatable segments extends as far as to at least one edge of the emission area of the light source. This is particularly advantageous as regards electrical connection of all the emitting elements of the light source. Specifically, the respective connections of each selectively activatable segment to an electrical power source (not shown here) exterior to the light source may thus be made from one edge of the light source 1. All of the emitting elements of a selectively activatable segment are connected together, in particular via a conformation of the electrode produced on the lower face of the substrate, and hence if electrical power can reach one of the emitting elements it can reach all of the corresponding segment.

According to the invention, the light source is arranged so as to form three selectively activatable segments, and two neighbouring segments may be separated by physically producing a small wall that protrudes from the substrate 10, it being understood that this separation may also be achieved solely by way of the way in which the emitting elements 8 are wired together.

The three selectively activatable segments each have a shape such that the third segment extends from a lateral edge 38 of the light source, which, in a first case of application, namely a vehicle driven on the left-hand side of the road, is arranged on the right-hand side of the light source when the latter is in emission position in the lighting module, and which, in a second case of application, namely a vehicle driven on the right-hand side of the road, is arranged on the left-hand side of the light source when the latter is in emission position in the lighting module.

It will be understood that the arrangement of the lateral edge 38 and the consequent arrangement of the third segment 33 are here defined with respect to the light source seen face-on. As a result, taking the example of FIGS. 3 to 5, in which the lateral edge 38 is on the right-hand side of the source when this source is seen face-on, the portion of the beam corresponding to the rays emitted by this third segment, which is placed on the right-hand side of the source seen face-on and therefore to the left of the optical axis seen from the driver's point of view, is a right-hand portion of the beam, the rays being projected, in a direct-imaging mode, directly from the source onto the forming optic.

According to the invention, it is advantageous that the same light source can be used in both cases of application, with merely a rotation about an axis O1 perpendicular to the emission area and passing through the centre of the emission area. Such as may be seen in FIG. 3, the axis O1 may pass through the centre of the light source, and form, in the plane of the emission area, a point distinct from the point of intersection 36 of the various selectively activatable segments.

Each of these cases of application will be described below as will the way in which the source is pivoted in each case. To this end, the light source may include means for poka-yoking its installation in the lighting module.

The poka-yoking means may consist of a marker of specific colour or shape placed on the perimeter of the emission area. By way of nonlimiting example, FIGS. 3 to 7 illustrate a marker borne by a tab 40 of the light source, which is arranged on an edge defining the outline of the light source. This tab will possibly be an extension of the substrate. The marker produced on this tab is identifiable by an inspecting device during the installation of the light source in the lighting module. By way of example, the inspecting device will possibly consist of mechanical indexing means suitable for detecting, via shape interaction, whether the marker is in the desired place, or indeed of image-acquiring means. Provision will also possibly be made for the marker to be a colour dot produced in the emission area between emitting elements and the inspecting device may then consist of image-acquiring means capable of validating the presence of the coloured dot in the desired zone. It will be understood that this zone must be off centre with respect to the centre of the emission area in order to be specific to the position of the light source in each of the cases of application.

Figure 3:
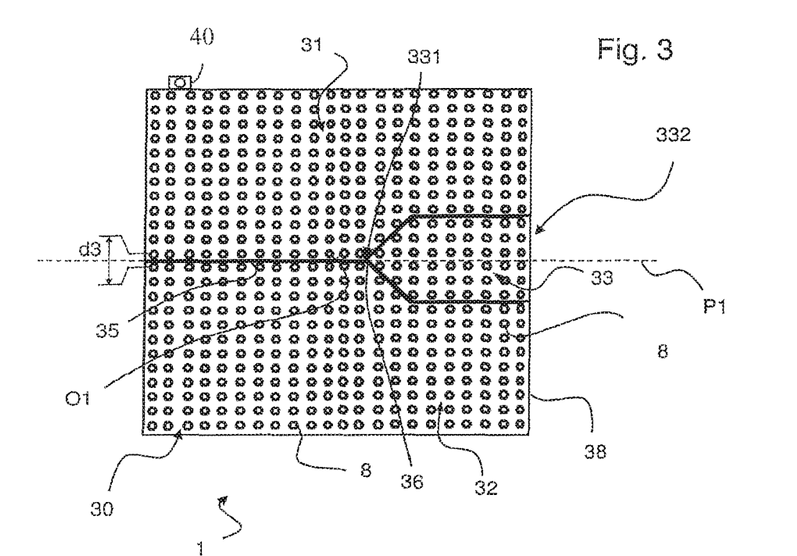
FIG. 3 is an illustration of the light-emitting area formed by the emitting elements of a monolithic light source of the type illustrated in FIG. 2, in which figure a division of the emission area into three selectively activatable segments each including a plurality of emitting elements has been shown.

Each of the selectively activatable segments contains a plurality of light-emitting rods of submillimetre dimensions, the rods respectively associated with each of these two segments being connected electrically so that the zones are selectively activatable, on either side of the separation. FIG. 3 shows the distance d3 separating a rod of a first segment 31 and a directly adjacent rod belonging to the second segment 32 or to the third segment 33. This separating distance d3, measured between two longitudinal light-emitting-rod axes, must be at least equal to 2 microns, in order for the light emitted by the circumferential wall 28 of each rod 8 to be able to exit from the matrix array of light-emitting rods, and it is sought to have a separating distance d3 between two rods of two different sources that is substantially equal to the distance d1 or d2 separating two rods of a given segment of the light source.

It should be noted that in the variant monolithic source such as was described above, namely emitting blocks that are formed by cutting and that protrude from a single substrate, each block forming a selectively activatable segment and thus a pixel, it will again be necessary to consider a separating distance between two pixels. This distance will in particular be smaller than 500 microns, and it will preferably be smaller than 200 microns.

Such as was stated above, the substrate is common to all the rods composing the various segments of the semiconductor light source. Thus, the number of electrically connecting wires is optimized and it is easier to bring the segments of the light source closer together, the adjoining nature of this arrangement being particularly advantageous with regard to obtaining a uniform flux when two segments of the semiconductor light source are activated simultaneously.

The method for implementing a light source such as described above, in order to produce two lighting functions, namely a non-dazzling lighting function (by way of a cutoff-containing beam) and a long-range lighting function, will now be described.

Figure 4:
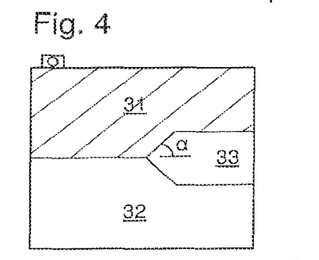
FIGS. 4 to 7 are examples of activation of the monolithic light source, illustrating control of the segments of selectively activatable emitting elements depending on whether it is desired to generate a "low beam" (FIG. 4) or "high beam" (FIG. 5) for a monolithic light source installed in a first position for a vehicle intended to be driven on the left-hand side of the road, and illustrating the control of segments of selectively activatable emitting elements depending on whether it is desired to generate a "low beam" (FIG. 6) or "high beam" (FIG. 7) for a monolithic light source installed in a second position for a vehicle intended to be driven on the right-hand side of the road.
Figure 5:
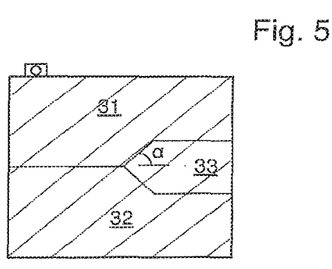

Reference is first made to FIGS. 4 and 5, which illustrate the light source according to the invention in a vehicle intended to be driven on the left, FIG. 4 showing the source configuration used to produce the non-dazzling lighting function and FIG. 5 showing the source configuration used to produce the long-range lighting function.

It will be understood that the lighting module into which this source is incorporated operates in a direct-imaging mode, i.e. the image projected onto the road scene is inverted with respect to the arrangement of the emitting elements in the emission area of the light source. Thus, when the light source is in its emission position at the focal point F of the forming optic 6, the segments of the beam corresponding to the top portion and bottom portion of the source, respectively, are projected onto the road scene far away from and close by the vehicle, respectively. Moreover, and such as was mentioned above, the segment of the beam corresponding to the right-hand portion of the source when seen face-on, i.e. in particular the third segment 32 in FIGS. 3 to 5, is projected onto the road scene on the right thereof as seen from behind the steering wheel by the driver.

As already stated, the various segments of the emission area 30 of the light source are activatable selectively from one another, and the beam projected by the associated optic when one of these segments emits rays is complementary to a beam projected when another segment of the emission area is activated. These complementary beams superpose to form a regulated motor-vehicle light beam.

All of the emitting elements of the emission area, and therefore each of the three segments of the light source, are activated to produce the long-range lighting function. Such as may be seen in FIG. 5, the first segment 31 is activated and it emits light rays (represented by the hatching), just like the second segment 32 and third segment 33. To produce this long-range lighting function, the three segments are activated simultaneously and the corresponding supply of electrical power is dimensioned so as to produce the maximum light intensity permitted by the dimensions and structure of each of the segments.

When it is desired to produce the non-dazzling lighting function, such as may be seen in FIG. 4, only the first segment 31 is activated. The second segment 32 and the third segment 33 emit no rays (represented by the lack of hatching), the second segment being located near the bottom in this arrangement so that the upper portion of the beam projected by the forming optic is dark and does not dazzle other users in the road scene. The activation of the first segment 31 but not the third segment 33 allows a step to be formed in the emitted beam, i.e. the upper limit of the projected beam is as a result no longer rectilinear and parallel to the horizon line.

To produce this cutoff-containing lighting function, the first segment 31 is activated independently of the second segment 32 and the third segment 33, and the corresponding supply of electrical power needed to activate this first segment is dimensioned so as to produce a light intensity comprised between 30 and 50% of the maximum light intensity permitted by the dimensions and structure of this first segment.

Figure 6:
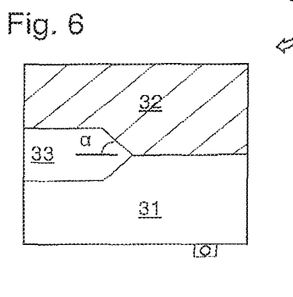
Figure 7:
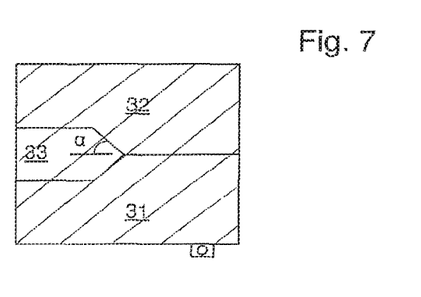

Reference will now be made to FIGS. 6 and 7, which illustrate the light source described above with reference to FIGS. 4 and 5 in a lighting module of a vehicle intended to be driven on the right. The light source is on this occasion pivoted by 180° about an axis of rotation that is perpendicular to the plane of the emission area and that passes through the junction zone joining the first segment and the second segment. In accordance with the earlier description, FIG. 6 illustrates the configuration of the source for the production of the non-dazzling lighting function and FIG. 7 the configuration of the light source for the production of the long-range lighting function.

The method differs in that, to produce the non-dazzling lighting function, it is the second segment 32 that is activated, independently of the first segment 31 and the third segment 33, which for their part remain inactive, since, after the 180° rotation of the light source, it is now the second segment 32 that is located above the first segment 31 in the emission position of the light source and it is therefore the rays emitted by the second segment 32 that correspond to the bottom portion of the projected beam output from the forming optic. It will be noted that, in this case, the third segment 33 is this time placed on the left-hand side of the light source when it is seen face-on, and therefore that the corresponding rays, forming the step in the cutoff-containing beam, are on the left-hand side of the projected beam, so that the cutoff of the beam that results from turning on only the second segment, i.e. excluding the third segment, is specific to a vehicle intended to be driven on the right-hand side of the road.

Moreover, similarly to above, all of the segments are activated when it is desired to produce a long-range lighting function.

As a result of the above, according to the invention, when a cutoff-containing beam must be emitted, the control module 34 generates instructions that turn on either the first or the second segment, the choice as to whether it is the first segment or second segment that is activated depending on the orientation of the light source.

The lighting method according to the invention thus includes a step of gathering information relating to the orientation of the light source, for example by way of the image-acquiring systems described above.

Figure 8:
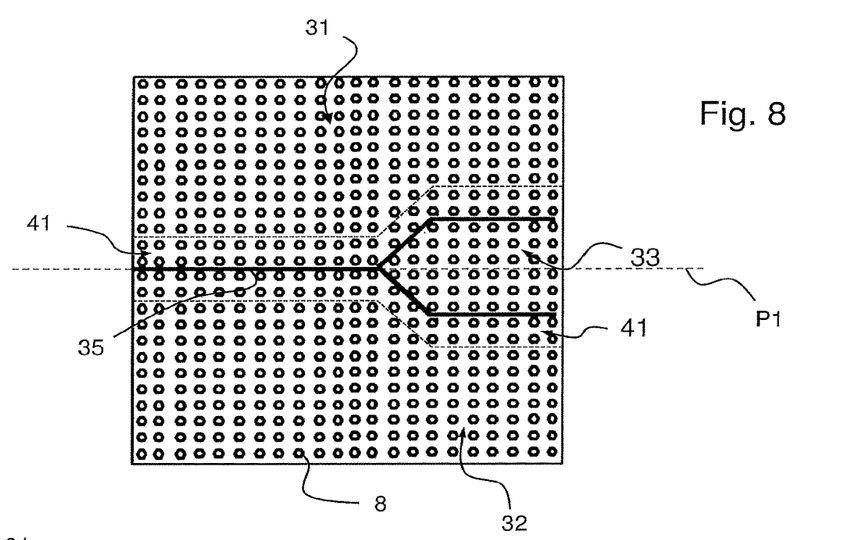
FIG. 8 is an illustration, similar to that of FIG. 3, of a monolithic light source of the type illustrated in FIG. 2, according to a first variant embodiment in which two of the three segments each comprise a subset of emitting elements.

A first variant embodiment, which is illustrated in FIG. 8, and which differs from the cases presented above in that the first and second segments 31, 32 of the emission area 30 include sets of emitting elements that are controlled separately from one another within the same segment, and which form lighting subsets 41, will now be described.

Each of the first and second segments includes a subset 41 that is arranged along the length of the third segment 33, and along the length of the contact zone 35 between these two segments, starting at the point of intersection 36. In FIG. 8, each subset has been bounded by a dashed line. In the illustrated example, each subset 41 extends the entire length of the contact zone between the first segment and the second segment, but provision will possibly be made, without departing from the scope of the invention, for the subsets to not extend from one lateral edge of the light source to the other: in this case they extend the entire length of the zone of contact with the third segment and some of the length of the contact zone between the first segment and the second segment.

The width of each subset is advantageously constant over all its extent: for example from one edge of the emission area of the source to the other.

When all of the selectively activatable segments are activated to produce a long-range lighting function, the emitting elements are supplied with power so that they emit to 100% of their capacities, so that it is not possible to identify the light emission produced by the emitting elements corresponding to the subsets of each of the first and second segments.

In contrast, when only the first or second segment 31 or 32 is activated in order to produce a non-dazzling lighting function, the rays emitted by the emitting elements corresponding to the subset of this first or second segment are the rays that form that portion of the beam which is closest to the cutoff. This subset 41 is then controlled so as to produce light that is brighter with respect to the rest of the beam produced by the rays emitted by the first or second segment, in order to create a clear contrast at the cutoff edge of the beam and to improve the compromise between the desire to avoid dazzling other road users and the effectiveness of the illumination in the direct vicinity of the vehicles of these other users.

The subset 41 of either the first segment 31 or second segment 32 is activated to produce the first lighting function so as to produce a light intensity substantially equal to 50% of the maximum light intensity permitted by the dimensions and structure of the emitting elements composing said subset, whereas the rest of the corresponding first or second segment is activated to produce the first lighting function so as to produce a light intensity substantially equal to 30% of the maximum light intensity permitted by the dimensions and structure of the emitting elements composing it, the emitting elements of the subset and of the rest of the first or second segment being identical.

In this context, in a given segment, the density and/or height of the rods 8 in the subset and the density and/or height of the other rods may be different. Thus the extent of the emitting portions in the emission area is modified by increasing the height of the circumferential wall 28 or by multiplying the number of rods and of these circumferential walls, and thus the light intensity emittable by a portion of the segment is increased with respect to the rest.

Alternatively or cumulatively, provision will possibly be made for the emitting elements arranged in the subset to be supplied with more power than the rest of the emitting elements of the corresponding segment.

Figure 9:
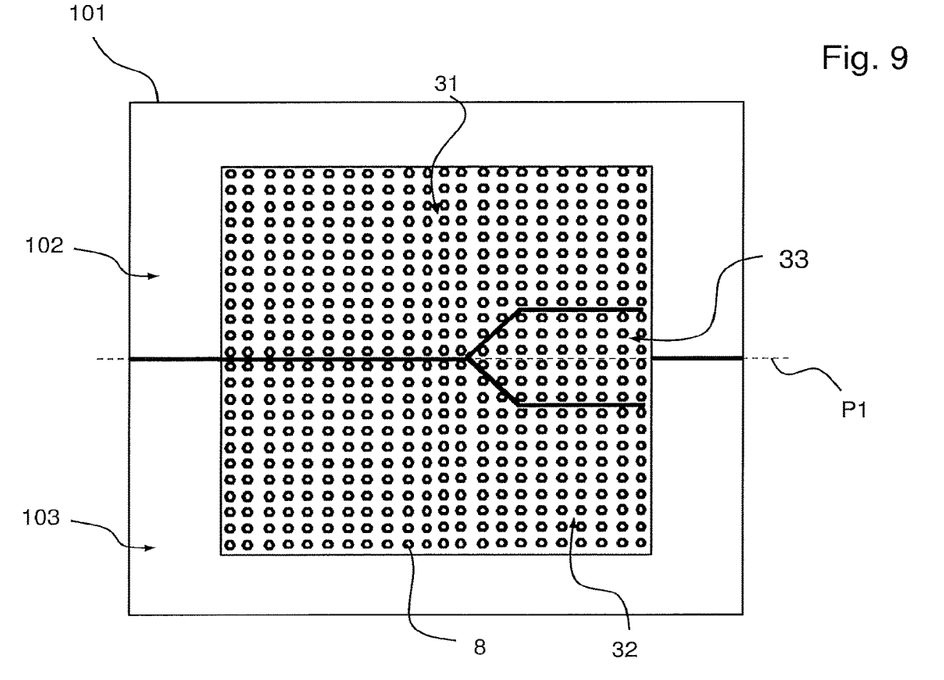
FIG. 9 is an illustration, similar to that of FIGS. 3 and 4, of a monolithic light source of the type illustrated in FIG. 2, according to a second variant embodiment in which the emitting area corresponding to the three segments is encircled by two additional symmetric segments.

A second variant embodiment is illustrated in FIG. 9, in which the light source 1 such as was described above furthermore includes a peripheral portion 101 that is formed from two additional segments 102, 103 and that encircles the first, second and third selectively activatable segments 31, 32 and 33 of the light source. These two additional segments are arranged symmetrically on either side of the plane of symmetry P1 of the light source. It will be understood that whether the light source is installed in a headlamp for a vehicle intended to be driven on the left or for a vehicle intended to be driven on the right, these additional segments are unaffected and may be left in position whereas the first, second and third segments of the light source are pivoted.

In the case where it is desired to produce a lighting beam of the "low beam" type, only the upper portion of the light source is activated, i.e. the first segment in the case of driving on the left and the second segment in the case of driving on the right, and therefore only the first additional segment 101 encircling more specifically the upper portion of the light source is activated.

In the case where it is desired to produce a lighting beam of "high beam" type, with all of the segments of the light source activated, it will be understood that the first additional segment 101 and the second additional segment 102 are activated.

The present invention most particularly applies to a front motor-vehicle headlamp. Such a headlamp may include a lighting module such as was illustrated in FIG. 1 and described above, and it will possibly include a complementary lighting module configured to form a beam that is complementary to the beam output from the lighting module.

The above description clearly explains how the invention allows the objectives that were set to be achieved and in particular a lighting device that allows, at lower cost, and without loss of photometric quality, a dual-function light, i.e. a light that allows a non-dazzling cutoff-containing lighting function and a long-range lighting function to be produced with a single forming optic, to be provided. The combination, according to the invention, of a monolithic source, for example a semiconductor source based on light-emitting rods, and a simple forming optic, i.e. by way of example a convergent lens and/or a parabolic mirror, is particularly advantageous, this avoiding the need for there to be intermediate optical surfaces between these two elements.

The use of a monolithic source is particularly advantageous in that it allows a plurality of segments that are separated from one another by oblique dividing lines to be formed in the emitting zone, and in that it allows, in this context, the light emitted from all of each of the segments and in particular from the tips formed by the oblique dividing lines to be uniform. It will be understood that this cannot be achieved with conventional LEDs, i.e. with a square blue chip soldered to a printed circuit board and covered with luminophore.

Of course, various modifications may be made, by a person skilled in the art, to the structure of the lighting device that has just been described by way of nonlimiting example, provided that said structure continues to use at least one light source comprising segments of emitting elements that are selectively activatable and that are controlled so as to generate a cutoff-containing beam of a first type, i.e. for vehicles driven on the left, when the light source is in a first position, and a cutoff-containing beam of a second type, i.e. for vehicles driven on the right, when the light source is in a second position. In any case, the invention is not limited to the embodiments specifically described in this document, and encompasses in particular any equivalent means and any technically workable combination of these means.

The invention claimed is:

1. A monolithic light source for a motor-vehicle lighting module, comprising:
an emission area formed by a plurality of light-emitting rods of submillimeter dimensions, and configured so that the plurality of light-emitting rods are arranged in at least three selectively activatable segments, the at least three selectively activatable segments including:
a first segment and a second segment, which are symmetric to each other with respect to a plane of symmetry and which have a contact zone that extends along at least a portion of the plane of symmetry, and
a third segment, which extends from one end of the contact zone and which extends symmetrically on either side of the plane of symmetry,
wherein the third segment has a strip shape, wherein a thickness at one internal end of the strip shape gradually decreases in order to form a tip, and
wherein an apex of the tip is coincident with a point of intersection of the first, second and third selectively activatable segments.

2. The monolithic light source according to claim 1, wherein the tip makes, in the emission area, an angle with the plane of symmetry that is between 15° and 90°.

3. The monolithic light source according to claim 1, wherein the tip makes, in the emission area, an angle with the plane of symmetry that is equal to 35°+/−5°.

4. The monolithic light source according to claim 1, wherein the emission area is rectangular.

5. The monolithic light source according to claim 4, wherein each of the first, second and third emission segments extends as far as to one edge of the emission area.

6. The monolithic light source according to claim 1, wherein a subset of the plurality of light-emitting rods in the first segment are configured to emit rays of light higher in intensity than rays of light emitted by a remainder of the plurality of light-emitting rods in the first segment that are not in said subset.

7. The monolithic light source according to claim 1, wherein the light source includes means for poka-yoking an installation of the light source in the motor-vehicle lighting module.

8. A lighting method for a motor vehicle, implementing control of a monolithic light source according to claim 1 to produce (a) a non-dazzling first lighting function by projection of a cutoff-comprising beam or (b) a long-range second lighting function by projection of a second cutoff-free beam, the method comprising:
   detecting an orientation of the monolithic light source;
   activating each of the three segments of the light source to produce the long-range second lighting function; and
   activating only one either the first segment or the second segment from the first, second and third segments to produce the non-dazzling first lighting function based on the detected orientation of the monolithic light source.

9. The lighting method according to claim 8, wherein the first, second and third segments are activated to produce the second lighting function so as to produce the maximum light intensity permitted by the dimensions and structure thereof.

10. The lighting method according to claim 8, wherein either the first segment or second segment is activated to produce the first lighting function so as to produce a light intensity between 30 and 50% of the maximum light intensity permitted by the dimensions and structure thereof.

11. A monolithic light source for a motor-vehicle lighting module, comprising:
   an emission area formed by a plurality of light-emitting rods of submillimeter dimensions, and configured so that the plurality of light-emitting rods are arranged in at least three selectively activatable segments, the at least three selectively activatable segments including:
      a first segment and a second segment, which are symmetric to each other with respect to a plane of symmetry and which have a contact zone that extends along at least a portion of the plane of symmetry, and
      a third segment, which extends from one end of the contact zone and which extends symmetrically on either side of the plane of symmetry,
   wherein each of the first and second segments includes a subset of the plurality of light-emitting rods arranged along the third segment and at least partially along the contact zone between the first and second segments from a point of intersection.

12. The monolithic light source according to claim 11, wherein each subset of the plurality of light-emitting rods extends along the entire length of the contact zone between the first segment and the second segment.

13. The monolithic light source according to claim 12, wherein a width of each subset is constant from a first edge of the emission area to a second edge of the emission area.

14. The monolithic light source according to claim 11, wherein the emission area is rectangular.

15. A lighting module comprising:
   a forming optic; and
   a monolithic light source comprising:
      an emission area formed by a plurality of light-emitting rods of submillimeter dimensions, and configured so that the plurality of light-emitting rods are arranged in at least three selectively activatable segments, the at least three selectively activatable segments including:
         a first segment and a second segment, which are symmetric to each other with respect to a plane of symmetry and which have a contact zone that extends along at least a portion of the plane of symmetry, and
         a third segment, which extends from one end of the contact zone and which extends symmetrically on either side of the plane of symmetry,
      wherein the third segment has a strip shape, wherein a thickness at one internal end of the strip shape gradually decreases in order to form a tip, and
      wherein an apex of the tip is coincident with a point of intersection of the first, second and third selectively activatable segments.

16. The lighting module according to claim 15, wherein the monolithic light source and the forming optic are configured so that rays emitted by the monolithic light source strike the forming optic directly, without intermediate deviation.

17. The lighting module according to claim 16, wherein the forming optic is configured to deform along at least one axis an image formed by the monolithic light source.

18. The lighting module according to claim 15, wherein an emission area of the monolithic light source is square, with a side length substantially equal to 2.62 mm, and wherein the monolithic light source is placed at a focal point of the forming optic.

19. The lighting module according to claim 18, wherein the forming optic has a focal point of 30 mm therefrom.

20. The lighting module according to claim 15, wherein the lighting module is a motor-vehicle headlamp.

* * * * *